US005817976A

United States Patent [19]

Yanase et al.

[11] Patent Number: 5,817,976

[45] Date of Patent: Oct. 6, 1998

[54] ELECTRICAL JUNCTION BOX

[75] Inventors: Takeshi Yanase; Kunihiko Takeuchi, both of Shizuoka, Japan

[73] Assignee: Yazaki Corporation, Tokyo, Japan

[21] Appl. No.: 229,439

[22] Filed: Apr. 12, 1994

[30] Foreign Application Priority Data

Apr. 14, 1993 [JP] Japan .................................... 5-18984

[51] Int. Cl.[6] .......................... H05K 5/00; H01R 13/68; H02B 1/26

[52] U.S. Cl. ...................... 174/52.1; 361/641; 439/76.2; 439/621

[58] Field of Search ............................ 174/52.1, 58, 59; 361/641, 642, 646, 648; 439/76.1, 76.2, 81, 721, 251, 620, 621, 622, 638, 639, 640, 366, 368

[56] References Cited

U.S. PATENT DOCUMENTS

| | | | |
|---|---|---|---|
| 4,689,718 | 8/1987 | Maue et al. | 361/641 |
| 4,850,884 | 7/1989 | Sawai et al. | 439/76.2 |
| 4,923,411 | 5/1990 | Hayashi et al. | 439/76.2 |
| 4,944,684 | 7/1990 | Leibowitz | 439/76.2 |
| 4,950,168 | 8/1990 | Watanabe et al. . | |
| 4,963,099 | 10/1990 | Sato et al. | 439/76.2 |
| 4,972,295 | 11/1990 | Suguro et al. | 361/641 |
| 5,067,905 | 11/1991 | Matsumoto et al. | 439/76.2 |
| 5,207,591 | 5/1993 | Ozaki et al. | 439/76.2 |
| 5,295,842 | 3/1994 | Ozaki et al. | 439/76.2 |

FOREIGN PATENT DOCUMENTS

| | | |
|---|---|---|
| 647505 | 2/1994 | Australia . |
| 091 835 | 10/1983 | European Pat. Off. . |
| 104 013 | 3/1984 | European Pat. Off. . |
| 107 153 | 5/1984 | European Pat. Off. . |
| 39 08 481 A1 | 1/1990 | Germany . |
| 55-47931 | 4/1980 | Japan . |
| 2-47164 | 10/1990 | Japan . |
| 4-42722 | 2/1992 | Japan . |
| 2 221 099 | 1/1990 | United Kingdom . |

*Primary Examiner*—Teresa J. Walberg
*Assistant Examiner*—Sam Paik
*Attorney, Agent, or Firm*—Armstrong, Westerman, Hattori, McLeland, & Naughton

[57] ABSTRACT

An electrical junction box for connecting wire harnesses in which the configuration of inner circuit and its manufacturing process are simplified. The electrical junction box comprising: a top cover with a plurality of cavities for accommodating electrical parts such as fuses and relays; a bottom cover fixed to the top cover, the bottom cover having housing portions in which terminals at ends of wires constituting a wire harness are accommodated, the bottom cover having a plurality of sub harness bottom covers adapted to a plurality of sub wire harnesses which are classified according to the destination of the wires and load system; and electrical circuits accommodated between the top and bottom covers, the terminals at ends of the wires and the electrical parts being connected to the electrical circuits, wherein the plurality of cavities and the electrical circuits are arranged to form blocks in accordance with the sub harness bottom covers.

3 Claims, 4 Drawing Sheets

ELECTRICAL JUNCTION BOX

BACKGROUND OF THE INVENTION

1. Field of the Invention

This invention relates to an electrical junction box used for connecting wire harnesses in which the configuration of inner circuit and its manufacturing process are simplified.

2. Description of the Prior Art

A construction of a conventional electrical junction box and a method of mounting wire harnesses to the junction box are disclosed in Japanese Patent Publication No. Heisei 2-47164. The conventional wire harness mounting method comprises the steps of: mounting a preliminarily locking member with the same shape and dimension as an electrical junction box comprising a top cover and a bottom cover to a plurality of circuit boards in a preliminarily locking member mounting process; and integrally forming a plurality of connector housing portions on the bottom cover and inserting terminals with wires into the bottom cover so as to be connected with the housing portions in a wire harness manufacturing process; removing the preliminarily locking member and assembling the bottom cover and the top cover in an assembling process.

In the conventional electrical junction box, included are bus bars constituting inner circuits, female connector housings, blade-type fuses, circuit breakers, and relays.

In such conventional electrical junction box described above, all of the plurality of connector housing portions to which wire harnesses are attached are integrally formed with the bottom cover, causing following problems.

A tab is integrally formed, as a terminal, with each of the bus bars of the layer-built circuit boards by bending an end portion thereof, and it is required that the bus bars are configured to properly arrange and accommodate the tabs in the connector housings in position. As a result, the configuration of the bus bars is complicated and the number of layers of the circuit boards are increased.

Further, sub wire harnesses (hereinafter referred as "sub harnesses"), which are united in accordance with directions or connecting ends of the wires such as head lamps, an engine room, instruments mounted on an instrument panel, a console box, and wire harnesses for doors, or united according to the function of electrical appliances (load system), are connected to each of the connector housing portions. However, since all of the connector housing portions are concentrated to the bottom cover only, or concentrated to the top cover, the electrical junction box can not be assembled by separately or independently connecting each of the sub harnesses to the bottom cover. As a result, a number of wires crosses each other to make the assembling work rather complicated, which causes erroneous insertion of the terminal, resulting in unreliable quality of the electrical junction box.

Further, a terminal connector of another wire harness is connected to the female connector housings of the top cover. In ordinary female and male connectors, a double locking means is adopted to securely prevent terminals from being slipped off. That is, a male terminal and female terminal, which are accommodated in a terminal receiving chambers, or terminal accommodating cavities, of a female connector and a male connector, are engaged with resilient locking arms in the terminal receiving chambers to prevent the terminals from being slipped off. In addition to the above, rear holders with locking means are mounted to doubly lock the terminals.

However, the use of separate parts as the rear holder increases the number of assembling works, thus resulting in an increased manufacturing cost of the electrical junction box. Besides, it is difficult to adapt double locking member such as the rear holder to the female connector housing or the connector housing portions which are integrally formed with the top cover or the bottom cover, causing the terminals to insufficiently be sustained in the electrical junction box.

SUMMARY OF THE INVENTION

The present invention has been accomplished to eliminate the drawbacks described above and an object thereof is to provide an electrical junction box in which inner circuits are simplified; the design of the junction box is flexibly performed; the change of the specification and the manufacture of the junction box are carried out with ease; the connection of the wire harnesses and the junction box is simplified through divided sub harnesses; the quality of the junction box is improved; and the manufacturing cost thereof is decreased.

The electrical junction box according to the present: invention comprises: a top cover with a plurality of cavities for accommodating electrical parts such as fuses and relays; a bottom cover fixed to the top cover, the bottom cover having housing portions in which terminals at ends of wires constituting a wire harness are accommodated; the bottom cover having a plurality of sub harness bottom covers adapted to a plurality of sub wire harnesses which are classified according to the destination of the wires and load system; and electrical circuits accommodated between the top and bottom covers, the terminals at ends of the wires and the electrical parts being connected to the electrical circuits, wherein the plurality of cavities and the electrical circuits are arranged to form blocks in accordance with the sub harness bottom covers.

BRIEF DESCRIPTION OF THE DRAWINGS

The present invention will be more apparent from the ensuring description with reference to the accompanying drawing wherein.

DETAILED DESCRIPTION OF PREFERRED EMBODIMENTS

Figure 1:
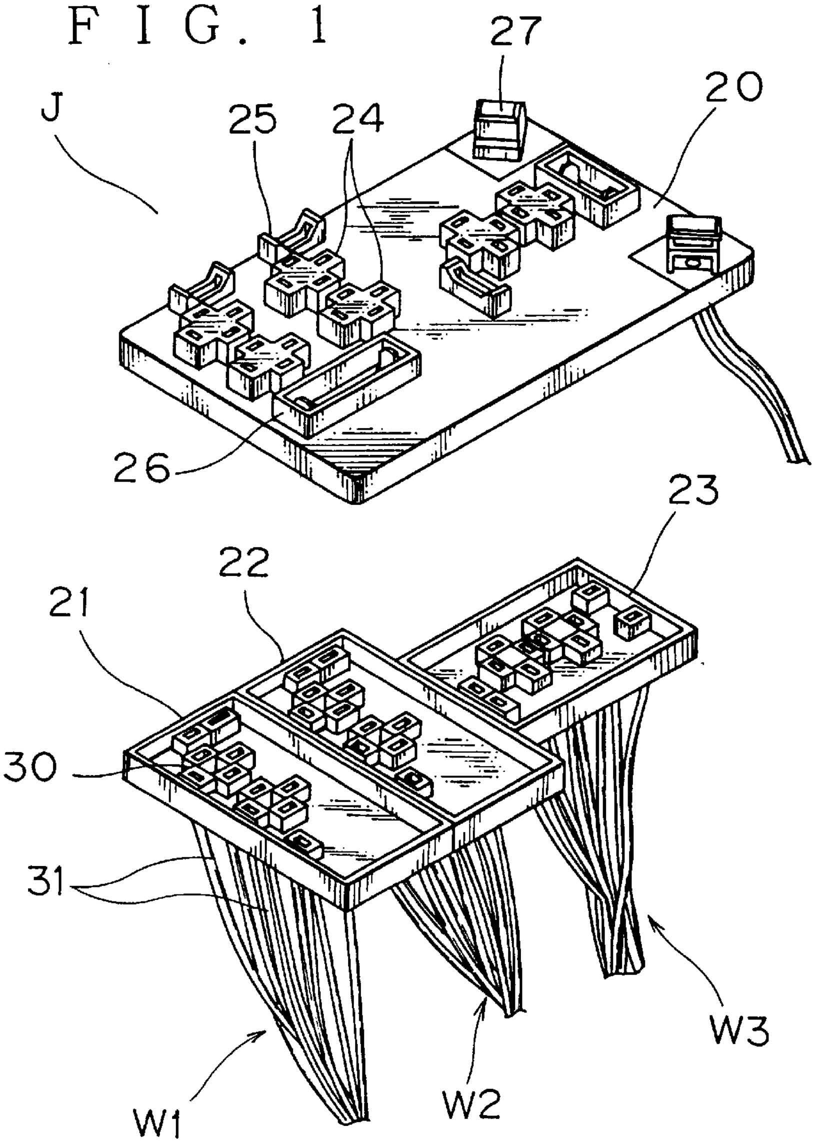
FIG. 1 is an exploded perspective view of a top cover and a bottom cover of an electrical junction box according to an embodiment of the present invention.
Figure 2:
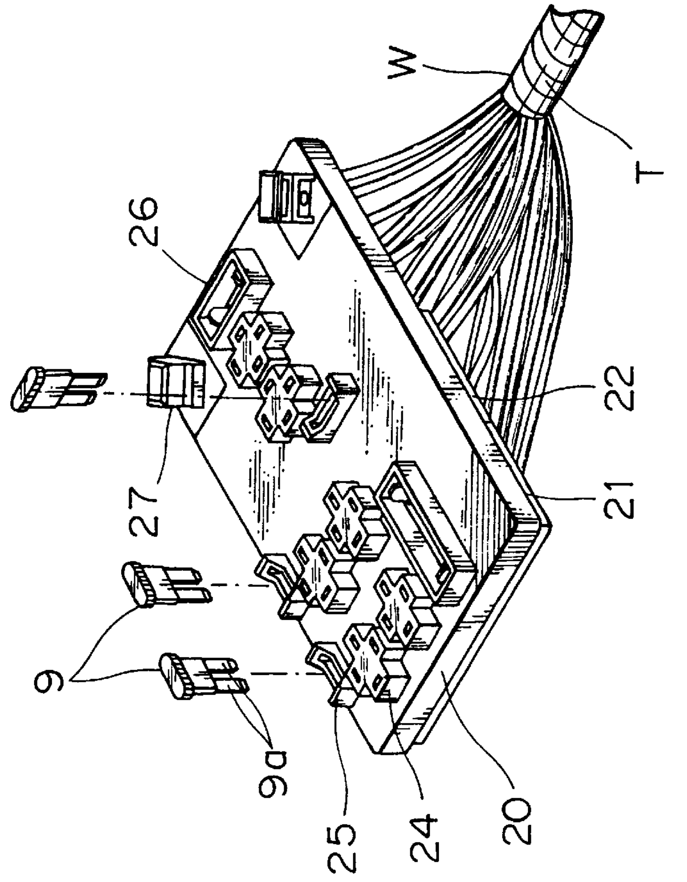
FIG. 2 is a perspective view of the top and bottom covers of FIG. 1 in assembly.

Referring to FIGS. 1 and 2, reference symbol J is an electrical junction box, and W a wire harness connected to the junction box. The wire harness W comprises sub harnesses W1, W2 and W3 divided according to the destination thereof and load system, and a tape T to gather the sub harnesses W1 to W3.

The electrical junction box J comprises: a top cover 20 made of synthetic resin insulating material and three bottom covers 21, 22 and 23 to which the sub harnesses W1 to W3 are connected. The bottom covers 21 to 23 are placed opposite to the top cover 20 and are connected thereto with known locking means or connecting means.

Relay cavities 24, fuse cavities 25, female connector housings 26 and fusible link cavities 27 are selectively disposed in position on an outer face of the top cover 20. Further, housing portions 30 are disposed on the bottom covers 21 to 23 to which male terminals 32 pressed to ends of the wires 31 are mounted as illustrated in FIG. 3.

Figure 3:
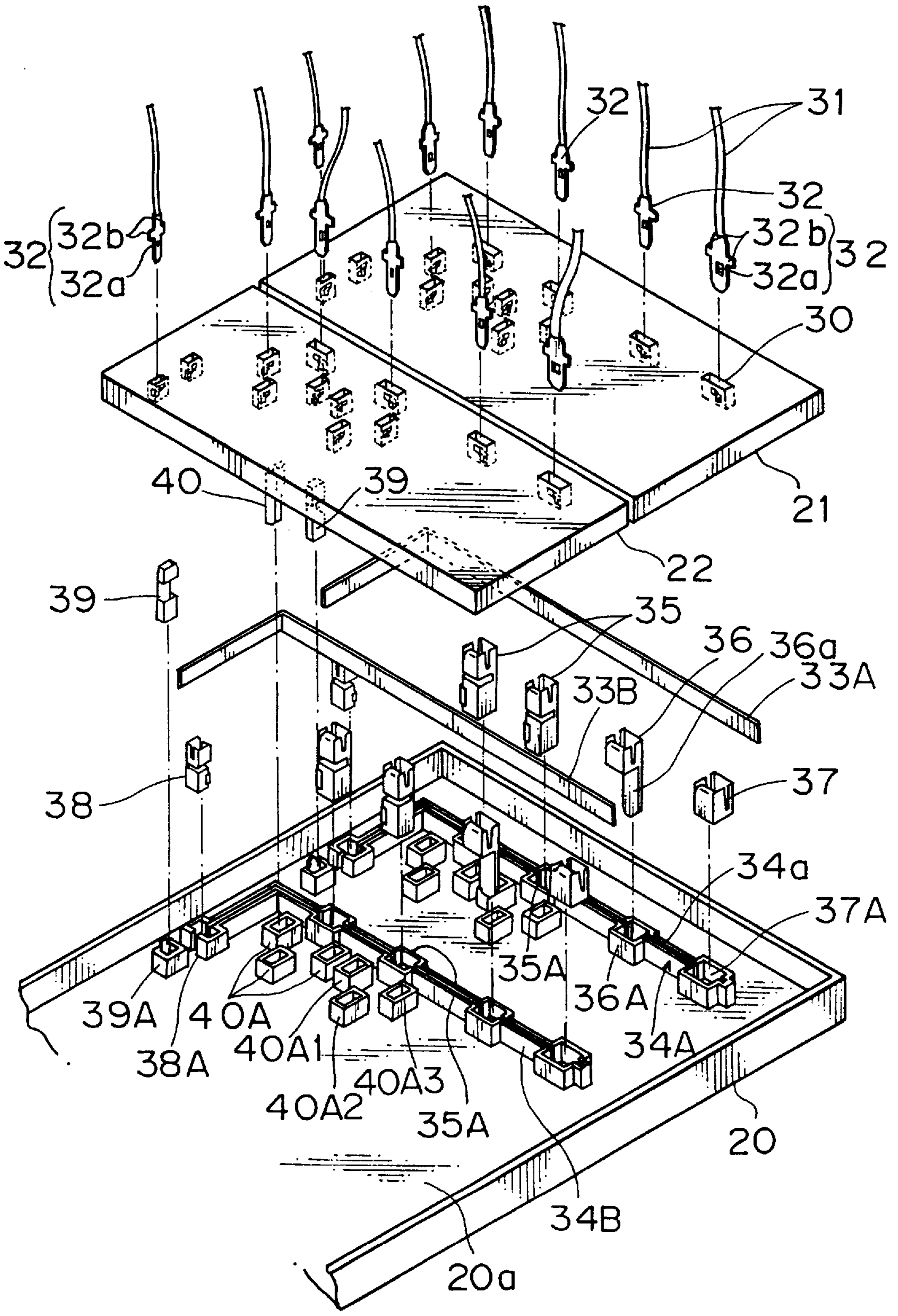
FIG. 3 is an exploded perspective view of a primary portion of the electrical junction box shown in FIG. 1.

FIG. 3 shows a perspective view of a primary portion of the electrical junction box J. In the figure, reference symbols 33A and 33B are L-shaped bus bars, which constitutes inner circuits of the sub harnesses W1 and W2 in the electrical junction box J. Supporting walls 34A and 34B with bus bar supporting channels 34*a* are formed vertical to an inner face of the top cover 20. Terminal accommodating cavities 35A to 38A, which are formed in accordance with the kinds of junction terminals 35 to 38, are situated at ends or intermediate portions of the supporting walls 34A.

Reference numerals 39 and 40 also show junction terminals, and the accommodating cavity 39A for the junction terminal 39 oppose the terminal accommodating cavity 38A at the end of the supporting wall 34A. Further, the terminal accommodating cavities 40A for the junction terminals 40 adapted to a male terminal 32 are situated in such a manner that a cavity 40A1 constituting the junction terminals 40A opposes the terminal accommodating cavity 35A and other cavities 40A2 and 40A3 oppose each other as illustrated in FIG. 3. The terminal accommodating cavities are arranged in consideration of the positions of four tabs (male terminals) not shown of the relay 11.

The housing portions 30 of the bottom covers 21 to 23 are disposed so as to oppose the terminal accommodating cavities 36A, 37A, 39A and 40A except for the terminal accommodating cavities 35A and 38A.

Figure 4:
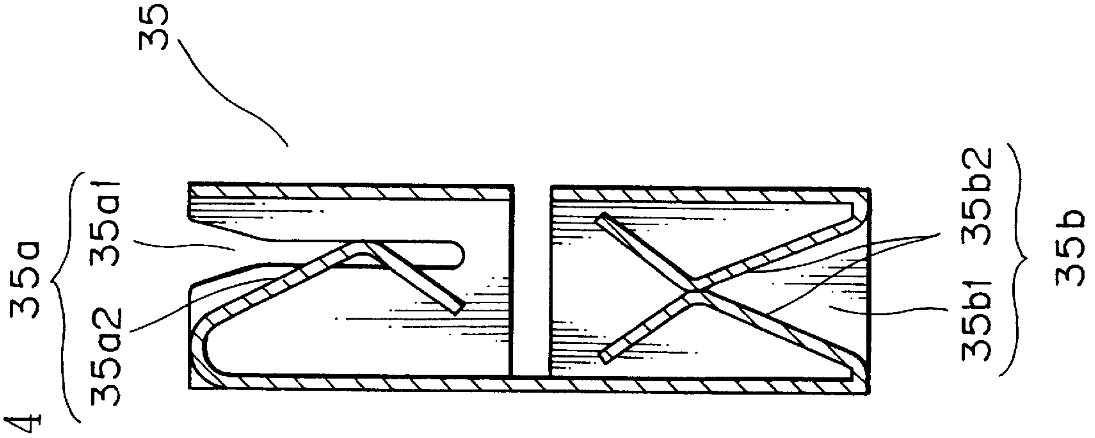
FIG. 4 is an enlarged cross-sectional view of a junction terminal 35 shown in FIG. 3.

The junction terminals 35 are used for connecting the tabs of the relay 11 to the bus bar 33A or 33B (hereinafter only the bus bar 33A is used for the explanation below). FIG. 4 shows the construction of the junction terminal 35, which comprises a bus bar connecting portion 35*a* and a tab connecting portion 35*b* which are integral with each other. The bus bar connecting portion 35*a* includes a pair of bus bar inserting channels 35*a*1 and a resilient contactor 35*a*2, and the tab connecting portion 35*b* is provided with a tab receiving cylinder 35*b*1 and resilient contactors 35*b*2 in the cylinder 35*b*1.

The junction terminal 38 has the structure similar to the junction terminal 35 and is used for connecting a tab 9*a* of a fuse 9 to the bus bar 33A. The junction terminals 36 and 37 are blanch junction terminals connected to the bus bar 33A. The junction terminal 36 itself is provided with a tab 36*a*, and the junction terminal 37 is connected to a male terminal 32 on the sub harness side. The junction terminals 39 and 40 are also so-called female-to-female junction terminals for connecting the fuses 9 of the male terminals 32 on the sub harness side to the tabs of the relay 11.

Figure 5A:
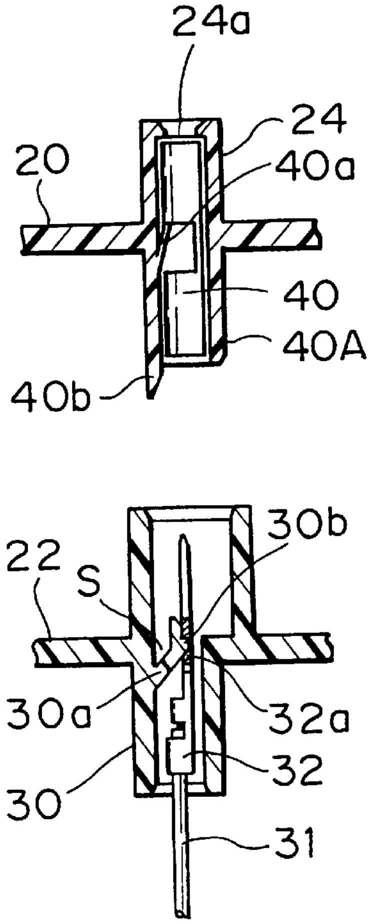
FIGS. 5A and 5B are an exploded perspective view of a relay cavity and a housing portion, and a cross-sectional view of those in assembly.
Figure 5B:
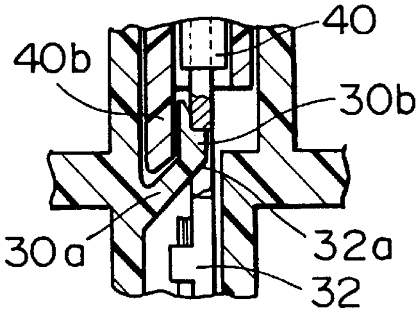

FIG. 5A is a cross-sectional view of the relay cavity 24 in FIG. 1 (the terminal accommodating cavity 40A in FIG. 3) and the housing portion 30 in the separate state, and FIG. 5B are those in assembly. The relay cavity 24 on an outer wall of the top cover 20 is integrally formed with the terminal accommodating cavity 40A, and a tab insertion hale 24*a* for the relay 11 is formed at an upper end portion of the cavity 24. Further, a resilient locking piece 40*a* is formed on an inner wall of the terminal accommodating cavity 40A to prevent the female-to-female terminal 40 from being upwardly and downwardly slipped off.

A projection 30*b* of a resilient locking arm 30*a* engages a locking hole 32*a* of the terminal 32 at the end of the wire 31 to prevent the terminal 32 from being slipped off.

The construction of the junction terminal 40 and the male terminal 32 are the same as the conventional terminals. However, in the present invention, a deformation preventing piece 40*b* projects from a lower portion of a peripheral wall of the terminal accommodating cavity 40A, and the piece 40*b* is formed in such a manner as to enter the space S between the inner wall of the housing portion 30 and the resilient locking arm 30*a*, that is, the piece 40*b* is capable of entering the space S where the locking arm 30*a* may entry due to bending.

The electrical junction box J with the construction described above is assembled in the following manner. The top cover 20 and the bottom covers 21 to 23 are independently assembled. After inserting the junction terminals 35 to 38 into the terminal accommodating cavitates 35A to 38A which are integral with the supporting walls 34A and 34B on the inner wall of the top cover 20, each of the bus bars 33A and 33B are pressed into the bus bar supporting channels 34*a*. As a result, the bus bars 33A and 33B are guided to the bus bar inserting channel 35*a*1 of the junction terminal 35, for example, then the bus bar 33A is in contact with the resilient contactor 35*a*2 illustrated in FIG. 4. Other junction terminals 36 to 38 also function in the same manner as the junction terminal 35. Corresponding female-to-female terminals 39 and 40 are inserted into the terminal accommodating cavities 39A and 40A respectively, and the terminals 39 and 40 are locked through the resilient locking pieces 40*a* in the same manner as described above.

The male terminals 32 at the ends of a plurality of wires 31 constituting the sub harness W1 are inserted into each of the housing portions 30 of the bottom cover 21 from outside and are locked therein through the engagement between the locking holes 32*a* and the resilient locking arms 30*a*. The bottom covers 22 and 23 are also assembled in this manner. As a result, the bottom covers 21 to 23 with the sub harnesses W1 to W3 are assembled.

Figure 7A:
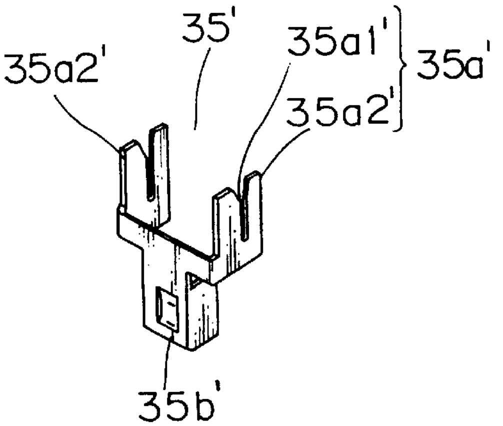
FIGS. 7A and 7B are perspective views of junction terminals according to other embodiments of the present invention.
Figure 7B:
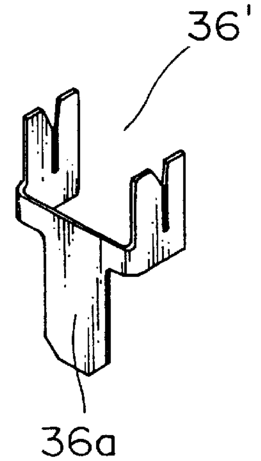
Figure 6:
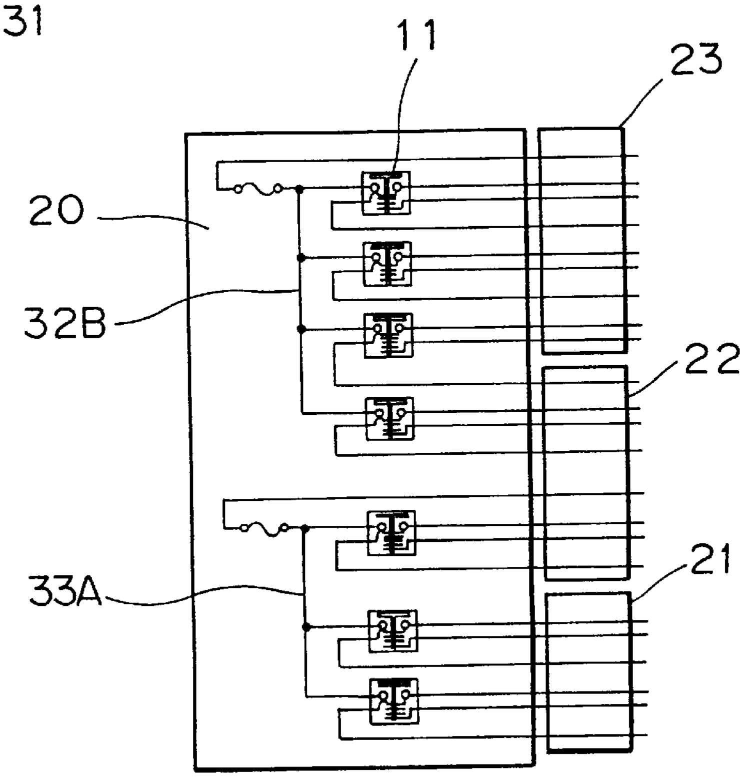
FIG. 6 is a wiring diagram of portions including fuses and relays of the electrical junction box shown in FIG. 1.

Then, the rear covers 21 to 23 are placed opposite to the top cover 20 and are fixed thereto one after another, and the relays 11 and the fuses 9 are accommodated in the relay cavities 24 and fuse cavities 25 to complete the assembling work of the electrical junction box J with the sub harnesses W1 to W3. For example, one of the four tabs of the relay 11 is inserted between the bus bar 33A of the junction terminal 35 in the terminal accommodating cavity 35A and the resilient contactor 35*a*2, and other three tabs are connected to the male terminals 32 at the ends of the wires 31 in the terminal accommodating cavities 40A1 to 40A3 through the junction terminals 40. FIG. 6 shows a wiring diagram adopted to the electrical junction box J according to one embodiment of the present invention. FIGS. 7A and 7B are perspective views of junction terminals with different constructions from those of the junction terminals 35 and 36. The junction terminal 35' includes bus bar connecting portions 35*a*' having a pair of press-contact pieces 35*a*2' with press-contact slots 35*a*1' for the bus bars 33A. This press-contact-type junction terminal 35' stabilizes the connecting condition in comparison to the ordinary contact-type junction terminal 35 to the resilient contactor 35*a*2. The junction terminal 36' is formed as a press-contact-type junction terminal with a tab 36*a* in the same manner as the junction terminal 36.

Although, the above explanation was made when the bus bars 33A and 33B are adapted to conductors of circuits in the electrical junction box, it is possible to use uncovered single wire conductors, single wire conductors with insulating coating, and twisted wire conductors. In such a case, press-contact-type junction terminals may be adopted as illustrated in FIG. 6. It is a matter of course that the bus bar as a member constituting inner circuit for a sub harness is not limited to L-shaped bus bar like the bus bars 33A and 33B but required number of bus bars with desired shape such as liner and U-shaped bus bars are usable in accordance with the configuration of the circuits.

With the construction of the electrical junction box according to the present invention, the connection of the wire harnesses to the electrical junction box can independently be carried out, which simplifies the configuration of the inner circuits. As a result, the design of the circuits can flexibly be performed to facilitate the change of the specification, and the manufacturing process is also simplified.

What is claimed is:

1. An electrical junction box comprising:

a top cover with a plurality of cavities for accommodating electrical parts, said electrical parts being at least fuses and relays;

a bottom cover fixed to said top cover, said bottom cover having housing portions in which terminals at ends of wires constituting a wire harness are accommodated, said bottom cover being formed of a plurality of sub harness bottom covers connected to a plurality of sub wire harnesses which are classified according to the destination of the wires and load system, said sub harness bottom covers being separate individual covers depending on the destination of the wires and load system; and electrical circuits accommodated between said top and bottom covers, said terminals at ends of the wires and the electrical parts being connected to said electrical circuits, wherein the plurality of cavities and said electrical circuits are arranged to form blocks in accordance with said sub harness bottom covers.

2. The electrical junction box as claimed in claim 1, wherein said plurality of cavities of the top cover oppose said housing portions of the plurality of sub harness bottom covers, and terminal accommodating cavities are integrally formed with the cavities on an inner face of the top cover, and junction terminals are accommodated in the terminal accommodating cavities, whereby the electrical parts are connected to bus bars and the terminals at ends of the wire of the sub harnesses through said junction terminals.

3. The electrical junction box as claimed in claim 2, wherein a resilient locking arm for locking the terminal is attached to an inner wall of each of the housing portions, and a deformation preventing piece is formed at an end of an outer peripheral wall of each of the terminal accommodating cavities, and the engagement of the housing portion and the terminal accommodating cavity causes said deformation preventing piece to enter into a space in the housing portion where said locking arm enters due to deformation.

* * * * *